US006631144B1

United States Patent
Johansen (10) Patent No.: US 6,631,144 B1
(45) Date of Patent: Oct. 7, 2003

(54) MULTI-RATE TRANSPONDER SYSTEM AND CHIP SET

(75) Inventor: Henrik Ingvar Johansen, Ballerup (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/468,606

(22) Filed: Dec. 21, 1999

(51) Int. Cl.[7] .................................................. H04J 3/06
(52) U.S. Cl. ........................................ 370/516; 375/355
(58) Field of Search ................................ 370/503, 516, 370/517, 518, 519, 535–542, 350; 375/219, 355, 358, 372–373, 376–377, 354

(56) References Cited

U.S. PATENT DOCUMENTS

| 4,641,303 A | | 2/1987 | Vogl | |
| 5,566,180 A | * | 10/1996 | Eidson et al. | 370/473 |
| 5,696,800 A | * | 12/1997 | Berger | 375/361 |
| 6,047,007 A | | 4/2000 | Munday | |

OTHER PUBLICATIONS

"Radio Type Data Carrier Equipment," Patent Abstracts of Japan, vol. 1995, No. 6, Jul. 31, 1995.

* cited by examiner

*Primary Examiner*—Dang Ton
*Assistant Examiner*—Inder Pal Mehra
(74) *Attorney, Agent, or Firm*—Blakely, Sokoloff, Taylor & Zafman LLP (57) ABSTRACT

A multi-rate transponder system has a receiving part, a system controller and a transmitting part. The receiving part includes a data transfer circuit, a clock transfer circuit, and a reference clock circuit. The receiving part receives the incoming serial data stream and derives a clock signal and a data signal. The data transfer circuit generates an incoming data signal based on the derived data signal. The clock transfer circuit generates a receiver clock signal. The reference clock circuit generates a reference clock signal for the transmitting part based on the derived clock signal. The system controller includes system data receiving and transferring means, and system data processing means. The system data receiving means receives the incoming data signal and the receiver clock signal and provides the incoming data signal for clock domain transfer. The system data processing means processes the incoming data signal to generate an outgoing data signal to the system data transfer means. The system data transfer means provides the outgoing data signal to the transmitting part in response to a transmitter clock signal. The transmitting part generates an output clock signal based on the reference clock signal, and includes a transmitter clock circuit to generate the transmitter clock signal to the system data transfer means, a data reception circuit to receive the outgoing data signal from the system data transfer means and to generate the serial outgoing data stream at an appropriate bit rate depending on the outgoing data signal and the output clock signal.

34 Claims, 3 Drawing Sheets

MULTI-RATE TRANSPONDER SYSTEM AND CHIP SET

FIELD OF THE INVENTION

The present invention relates to a multi-rate transponder system and circuits that support reception and transmission of serial data streams at nominal rates and of transport network rates according to one or several standard communication protocols, such as SDH STM-1/STM-4/STM-16/ STM-64 and 1.250 Gbit/s Gigabit Ethernet. The multi-rate transponder circuit may comprise a chip set that implements a front-end in high-speed Optical Network applications thereby providing interconnection between high-speed line interfaces and standard system controllers. These system controllers may be based on CMOS Application Specific Integrated Circuit (ASIC) technology or based on FPGA technology, and thereby unable to directly connect to and support the often required Gbit/s operation of the high-speed line interfaces.

BACKGROUND OF THE INVENTION

In high-speed digital communication systems, transponder chip sets, typically comprising a receiver chip and a transmitter chip, are utilised to amplify and reshape a, typically, distorted signal waveform of an incoming serial data stream or incoming data stream to provide a reshaped outgoing data stream of nominal amplitude. The distortion of the signal waveform is often created by the transmission characteristics, e.g. dispersion and amplitude attenuation, of network cables in the high-speed digital communication system.

In some applications, it is furthermore desirable to be able to receive and transmit data streams at increased bit rates or transport network bit rates as defined in the technical standard ITU-T G.975. According to this standard, data streams may be received and transmitted at a transport network bit rate which is defined as a bit rate that is an odd ratio factor higher than the nominal bit rate of the relevant communication protocol. Thus, data might be transmitted and/or received at the nominal bit rate multiplied with a scaling ratio such as 15/14, 16/15 32/31 etc. Accordingly, any nominal bit rate may have one or several corresponding transport network bit rate(s).

If the nominal bit rate of the utilised communication protocol is 2.488 Gbit/s, which is the case for STM-16, the chip set and the transponder system must be able to receive and transmit data at rates at the corresponding transport network bit rates of 2.666 Gbit/s and 2.568 Gbit/to support 15/14 and 32/31 transport network bit rates, respectively. The overhead data which are provided by the use of the transport network bit rates may be utilised for system level service purposes such as monitoring error rates of the data streams between network nodes and/or correcting errors using forward error correcting schemes according to ITU-T G.975. The overhead data may also be utilised for transmitting dedicated data belonging to the network operator together with ordinary transport stream data between network nodes. It is furthermore often required that the chip set and the transponder system should be capable of supporting reception/transmission of data streams at nominal bit rates of several differing communication protocols e.g. SDH STM-1, STM-4, STM-16, STM-64 etc.

Accordingly, it is desirable to provide a single transponder circuit, preferably as a chip set, and a corresponding transponder system that both support multi-rate data stream reception/transmission and also support one or several transport network bit rates at each selected nominal bit rate.

SUMMARY OF THE INVENTION

One object of the invention is to provide a single multi-rate transponder circuit, preferably as a chip set, and a corresponding multi-rate transponder system that are capable of supporting multi-rate reception and transmission of incoming and outgoing serial data streams, respectively, and furthermore support reception and transmission of transport network bit rates.

According to one aspect of the. invention, there is provided a multi-rate transponder system that is capable of receiving the incoming data stream at a nominal bit rate or at a corresponding transport network bit rate and wherein the bit rate of the outgoing serial data stream or outgoing data stream is independently selectable as either the nominal bit rate or the transport network bit rate.

DESCRIPTION OF THE INVENTION

A first aspect of the invention relates to a multi-rate transponder system for receiving an incoming data stream and transmitting an outgoing serial data stream, the multi-rate transponder system comprising:

a receiving part, a system controller and a transmitting part;

the receiving part comprising:
  a Clock and Data Recovery (CDR) circuit adapted to receive the incoming serial data stream at a nominal bit rate or at a corresponding transport network bit rate, the CDR circuit being adapted to derive a clock signal and a data signal from the incoming serial data stream, and
  a data transfer circuit adapted to generate an incoming data signal based on the derived data signal on one or several data transfer channels, and
  a clock transfer circuit adapted to generate a receiver clock signal on a receiver clock line, and
  a reference clock circuit adapted to generate a reference clock signal for the transmitting part based on a clock signal associated with the incoming serial data stream, the system controller comprising:
  system data receiving means, system data transfer means, system data processing means and a slide-buffer,
  the system data receiving means being adapted to receive the incoming data signal from the one or several data transfer channels and the receiver clock signal from the receiver clock line and to provide the incoming data signal to the slide-buffer for clock domain transfer, and
  the system data processing means being adapted to process the incoming data signal in the slide-buffer by inserting data bits into the incoming data signal and/or extracting data bits from the incoming data signal and/or monitoring data bits in the incoming data signal to generate an outgoing data signal to the system data transfer means on one or several data transfer channels, and
  the system data transfer means being adapted to provide the outgoing data signal to the transmitting part in response to a transmitter clock signal provided on a transmitter clock line, the transmitting part comprising:
  a transmitter Phase Locked Loop (PLL) adapted to receive and lock onto the reference clock signal and to generate an output clock signal based on the reference clock signal, a transmitter clock circuit adapted to generate the transmitter clock signal to the system data transfer means, a data reception circuit adapted to receive the outgoing data signal from the system data transfer means and to generate the serial outgoing data stream at the nominal bit rate or at the corresponding transport network bit rate independently of the bit rate of the incoming serial data stream, based on the outgoing data signal and the output clock signal.

In the present specification and claims the term "nominal bit rate" designates a bit rate that equals a bit rate of a standardised communication protocol. As an example, if the present multi-rate transponder circuit or system is adapted to support communication according to SDH STM-16, the nominal bit rate equals 2.488 Gbit/s. The term "transport network bit rate" designates a bit rate of a data stream that is increased with a scaling ratio relative to a corresponding nominal bit rate of that data stream. A number of standardised transport network bit rates associated with a nominal bit rate is recommended by ITU-T G.975. According to this standard, a transport network bit rate equals the nominal bit rate multiplied with a number of selectable odd ratio factors.

According to the present invention, the system controller may be comprise a proprietary microprocessor or a commercially available microprocessor and associated logic circuitry. The system controller may also be provided as an ASIC that comprises a fully proprietary microprocessor or a commercially available embedded microprocessor core or kernel integrated with custom designed logic circuitry. In some applications it may be advantageous to provide the system controller partly or fully in FPGA technology or other programmable logic technology for fast prototyping/debugging and/or on-the-fly re-programming of the functionality of the system controller. The system data receiving means and the system data transfer means which are responsible for receiving the incoming data signal from the receiving part and transmitting the outgoing data signal to the transmitting part may be implemented as respective data buses, each data bus comprising a plurality of data channels. For multi-rate transponder circuits or chip sets that are adapted to operate with bit rates of the incoming and outgoing data streams in the multi-GHz region, it may be necessary to intermediately convert the serial data streams to corresponding multi-channel data signals at a lower bit rate. This conversion may be required to properly interface the data streams to the system controller's data receiving and data transfer means. Alternatively, a single or both of the incoming and outgoing data signals may be communicated to/from the system controller over a respective high speed single data channel.

Where multi-channel data buses are utilised for communication of the incoming and outgoing data signals, a 16 channel data bus may be utilised both for data transmission between the system controller and the receiving part and for data transmission between the system controller and the transmitting part. However, any other practical number of channels could clearly be utilised, such as 4, 8, 32, 64 etc. Accordingly, the receiving part may comprise a demultiplexer circuit, operating synchronously to a clock signal that is based on the derived clock signal of the incoming data stream, receiving the derived data signal to generate an incoming multi-channel data signal representing the incoming data stream on the several data transfer lines. The transmitting part may comprise a multiplexer circuit adapted to receive an outgoing multi-channel data signal representing the outgoing data signal from the system data transfer means, the multiplexer circuit being adapted to generate the serial outgoing data stream based on the outgoing multi-channel data signal and the output clock signal.

The receiver clock signal that controls the transfer of the incoming data signal to the system data receiving mean is preferably scaled down from the received bit rate of the incoming data stream in proportion to the selected number of channels of the incoming data signal. Accordingly, if the incoming data stream is received at the 2.488 Gbit/s bit rate of STM-16 and a 16 channel incoming data signal is utilised, the receiver clock signal is preferably selected to 155.50 MHz so that, in each clock period of the receiver clock signal, 16 bits of data are transferred over the data bus.

If the receiving part and/or the transmitting part are provided as separate integrated circuit(s), it is particularly advantageous to reduce the bit rates of the incoming and outgoing data signals, since distributing and handling these multi-channel incoming and outgoing data signals through I/O pads of such separate integrated circuits is considerably simplified. This is also true for the signal handling on printed circuit board(s) that may hold the complete multi-rate transponder system.

The system controller comprises a so-called slide buffer which is a memory area for clock domain transfer and manipulation/monitoring of individual data bits in the incoming data signal. The bit manipulation that is required in a particular multi-rate transponder system will generally depend on a required functionality on the particular system in question. If the multi-rate transponder system is located at a destination node of the communication network, the overhead data, which may be provided by using the available transport network bit rate or increased bit rate, may be extracted from the incoming data signal and subjected to analysis and/or error correction by the system controller. The transport stream data, i.e. those data which are left after the overhead data have been extracted, may be transmitted as an outgoing data stream to the next network node of the communication system. In this situation, the bit rate of the outgoing data stream will be lower than that of the incoming data stream in accordance with the scaling ratio of the incoming data stream. Thus, for a 32/31 scaling ratio of the incoming data stream, the bit rate of the outgoing data stream will be 31/32 times that of the incoming data stream and will typically correspond to the nominal bit rate of a particular standard communication protocol. Alternatively, the opposite operation may be required in the system so that the bit rate of the incoming data stream is less than the bit rate of the outgoing data stream in accordance with the scaling ratio. This functionality could be relevant for applications wherein the system controller is adapted to insert overhead data into an incoming data stream of a nominal rate.

Another important application involves solely monitoring the individual data bits of the incoming data stream to monitor the operation of the communication network or monitoring the operation of a particular network node to network node connection or data link by calculating statistical properties such as error rates and error distributions of the data streams. In such an application, both the incoming and outgoing data streams may be received/transmitted at a selected transport network bit rate in accordance with the operation of the specific communication network. Finally, according to the invention, the multi-rate transponder system and circuits also support receiving and transmitting incoming and the outgoing data streams, respectively, at a nominal bit rate of a particular communication protocol. Thereby, the system and circuit are also capable of operating as "simple" transponder systems and circuits without utilising the supported transport network bit rate capability.

The reference clock circuit must be adapted to generate the reference clock signal for the transmitting part based on a clock signal derived from the incoming data stream when the incoming data stream is present and the multi-rate transponder system and circuits are in normal operation. The transmitter Phase Locked Loop (PLL) is adapted to receive and lock onto this reference clock signal and to generate the output clock signal based on the reference clock signal. Since all relevant communication systems in the present context are based on fully synchronous operation it is mandatory that the multi-rate transponder system and circuits provide the incoming and outgoing data streams synchronously with respect to each other. According to the invention, this has been achieved by extracting or deriving the reference clock signal from the incoming data stream and forwarding this reference clock signal to the transmitter PLL provided on the transmitting part or chip (where the multi-rate transponder circuit is provided as a chip set). The transmitter PLL circuit will hereby be locked onto the reference clock signal during normal operation, where an incoming data stream is present. The output clock signal must be based on a signal that is synchronous to the reference clock signal to provide a fully synchronous multi-rate transponder system and circuits. One or several divider circuits may be inserted between a transmitter PLL output signal, from which the output clock signal is derived, and the output clock signal to e.g. properly scale the bit rate of the outgoing data stream in accordance with the communication protocol of the communication network.

The reference clock circuit may be comprise one or several dividers coupled to the derived clock signal provided by the CDR circuit. The dividers may be arranged in parallel and/or cascade to the derived clock signal to provide a reference clock signal of a lower frequency than the derived clock signal.

The data reception circuit of the transmitting part may comprise a multiplexer that is adapted to receive a multi-channel outgoing data signal from the system data transfer means of the system controller and generate the serial outgoing data stream. Alternatively, if the outgoing data signal is provided on a single line, the serial outgoing data stream may be directly based on such an outgoing data signal and the multiplexer can be dispensed with. A transmitter clock signal is applied by the transmitting part to the system controller in order to control the transfer of the single or multi-channel outgoing data signal from the system data transfer means to the data reception circuit of the transmitting part. The transmitter clock signal may be provided by dividing the output clock signal or any other processing of the output clock signal that is capable of generating the transmitter clock signal synchronous to the output clock signal.

According to the invention, the bit rate of the outgoing data stream can be selected as being the nominal bit rate or the transport network bit rate, independently of the bit rate of the incoming data stream. Therefore, the bit rates of the incoming data signal and the outgoing data signal may differ, even where the same number of incoming and outgoing data signal channels, such as 16 or 32, are utilised for both data signals. A consequence of this is that the clock frequencies of the receiver clock signal and the transmitter clock signal may differ. Such a difference could, as an example, exist in an application wherein the multi-rate transponder system is adapted to receive an incoming data stream which comprises overhead data provided at the transport network bit rate and the system controller extracts these overhead data and solely conveys the transport stream data. The outgoing data stream will consequently contain fewer data bits than the incoming data stream by and should be transmitted at the nominal bit rate. A reversed situation applies when the system controller is adapted to insert overhead data into an incoming data stream received at the nominal bit rate.

The CDR circuit of the receiving part may comprise a line rate Phase Locked Loop (PLL) which is locked onto the incoming data stream during normal operation. In such an embodiment of the invention, the line rate PLL comprises a Voltage Controlled Oscillator (VCO) that generates an output signal which is coupled to a first phase detector input terminal through a receiver line divider circuit. A second phase detector input terminal must receive the incoming data stream, optionally through a input limiting amplifier and a phase detector output signal which represents the phase difference between the inputs may be provided to internal or external loop filter. This loop filter defines one or several time constants of the PLL loop. The receiver line divider circuit which is placed within the line rate PLL loop may provide one or several receiver line dividends. The CDR circuit may accordingly be tuned to a particular nominal bit rate of the incoming data stream by selecting a receiver line dividend which corresponds to this particular nominal bit rate. As an example, if the VCO is designed to operate with a free running frequency of about 2.488 GHz and the CDR circuit should be adapted to receive an incoming data stream with a nominal bit rate of e.g. 622 Mbit/s, a receiver line dividend of 4 should be selected. The system controller may be capable of selecting of the correct receiver line dividend if the receiving part is provided with a group of internal or external select pins or terminals that operates as a programmable interface between the system controller and receiver line divider circuit.

A first phase detector output signal, generated in response to the application of the divided VCO output signal and the line rate signal on its respective input terminals, may as previously explained control the charging of the loop filter so as to generate a control voltage. This control voltage may be fed back to the input of the VCO to control the actual oscillation frequency of the VCO. The use of such a PLL based CDR circuit allows an integrated circuit design engineer to, conveniently, simulate and control loop parameters and jitter tolerance of the CDR circuit and optimise these to any specific signal characteristics of the incoming data stream, by well-know methods. Alternatively, the CDR circuit may be based on a SAW resonator type of circuit topology, wherein a high Q resonance of a SAW device is utilised to tune the CDR circuit to the bit rate of the incoming data stream. However, the same degree of flexibility with respect to control over jitter tolerance and jitter transfer which is the case for the PLL based CDR circuit may be difficult to obtain, particularly where the SAW based CDR circuit should be capable of receiving and processing data streams at both nominal and one or several transport network bit rates.

The incoming data stream may be applied on a single terminal or on two terminals of the receiver chip as a single ended or as a differential input signal, respectively. Preferably, the incoming signal is coupled to a pair of differential input terminal(s).

According to a preferred embodiment of the invention, the transmitter part comprises at least two PLLs. A first transmitter PLL adapted to receive and lock onto the reference clock signal and generate a first transmitter PLL output signal, the first transmitter PLL having a narrow loop bandwidth, and a second transmitter PLL in series with the first transmitter PLL. The second transmitter PLL is preferably adapted to lock onto the output signal of first transmitter PLL and to generate the output clock signal based on the first transmitter PLL signal. The loop bandwidth of the second transmitter PLL being substantially wider than the loop bandwidth of the first transmitter PLL. By selecting loops of differing bandwidths, jitter transfer from the incoming data stream to the outgoing data stream is effectively suppressed in the multi-rate transponder system by the first transmitter PLL due to the narrow band lowpass filtering of modulation in the incoming data stream provided by the loop of the first transmitter PLL. Furthermore, jitter generation by the second transmitter PLL is, preferably, also minimised by selecting of a wide bandwidth of the second transmitter PLL and by utilising a low-noise VCO circuit within the loop.

The first transmitter PLL may comprise a VCXO circuit operating as a crystal based voltage controlled oscillator or a simple non-crystal based VCO circuit within the first transmitter PLL. VCXO circuits are commonly manufactured with a rather low control voltage sensitivity, i.e. the oscillation frequency is quite insensitive to an applied control voltage thereby automatically generating a loop of narrow bandwidth. Independent of whether a crystal or non-crystal based voltage controlled oscillator is utilised the loop bandwidth should preferably be less than 130 kHz, more preferably less than 80 kHz or even more preferably less than about 30 kHz for a multi-rate transponder circuit that operates with bit rates according to the STM-16/STM-1 communication standards.

To effectively suppress jitter generation in the second transmitter PLL, the loop bandwidth of the second transmitter PLL must be larger than 200 kHz, or more preferably larger than 400 kHz, or even more preferably larger than about 1 MHz such as about 2 MHz. The loop bandwidths of the first and second transmitter PLLs are preferably made adjustable by using respective external capacitors to set the respective time constants of the loops. External capacitors allow straightforward experimental fine-tuning of the jitter performance of the multi-rate transponder system while the system during real operation or during lab experimentation and prototype testing/evaluation.

The nominal bit rate is, preferably, related to the transport network bit rate according to a scaling ratio, so that:

transport network bit rate=(M/N)*nominal bit rate; wherein

M/N is the scaling ratio, M, N being positive integer numbers, and M>N.

Accordingly, odd scaling ratio factors, such as 15/14, 16/15, 32/31, 33/32, etc. for the transport network bit rate according to ITU-T G.975 may also be supported by the present multi-rate transponder system and circuits. Therefore M is preferably selected as: M=N+1, wherein N is selected from the group of integers consisting of: (32, 31, 16, 15, 14).

To support a number of independently selectable scaling ratios in the receiving part and the transmitting part of the multi-rate transponder system and circuits, these parts may include respective scaling divider circuits that each has a number of selectable scaling dividends. According to such an embodiment of the invention, the CDR circuit of the receiving part comprises:

a receiver scaling divider circuit adapted to receive the derived clock signal of the incoming data stream and to produce the reference clock signal for the transmitting part by dividing the derived clock signal with a selectable receiver scaling dividend, X, the receiver scaling divider circuit comprising a first group of selectable scaling dividends, each value of X being associated with a particular scaling ratio. The transmitting part comprises a transmitter scaling divider circuit arranged within the transmitter PLL and adapted to divide a PLL signal with a selectable transmitter scaling dividend, Y, the transmitter scaling divider circuit comprising a second group of selectable scaling dividends, each value of Y being associated with a particular scaling ratio, X, Y being independently selectable positive integer numbers.

Accordingly, the reference clock signal is produced by dividing the derived clock signal with the selected receiver scaling dividend, X, and the output clock signal of the transmitting part is generated based on the PLL signal which is produced by the transmitter PLL that has the transmitter scaling divider circuit arranged within its loop. Since the transmitter PLL is locked onto the reference clock signal, the frequency of the output clock signal is equal to that of the reference clock signal multiplied with the selected transmitter scaling dividend, Y, and thus making the bit rate equivalent to the frequency of the output clock signal equal to the bit rate of the incoming data stream multiplied with a scaling ratio, Y/X.

The line rate PLL, which should be capable of locking onto the incoming data streams at nominal rates and at one or several corresponding transport network bit rates, must be provided with a bandwidth sufficiently wide to support the difference in bit rates between the nominal rate and the highest transport network bit rate that the system should support. This difference in bit rates typically amounts to about 3–10% for commonly utilised scaling ratios such as 15/14 or 32/31.

By utilising the multi-rate transponder system's capability of supporting independent selection of the values of X and Y, the outgoing data stream may be transmitted at the same bit rate as the incoming data stream is received at, by selecting the value of X to equal the value of Y, independent of whether the incoming data stream is received at the nominal bit rate or at a corresponding transport network bit rate. Furthermore, by selecting the value of X larger than the value of Y, the bit rate of the outgoing data stream will be less than the bit rate of the incoming data stream. Consequently, where the incoming data stream is received at the transport network bit rate, the outgoing data stream may be transmitted at the corresponding nominal bit rate by appropriate selection of Y and X in the transmitting and receiving part, respectively.

According to this embodiment of the invention, the previously-mentioned preferred scaling ratio or ratios, M/N (M and N being positive integers), between the nominal bit rate and the corresponding transport network bit rate may be obtained in a straight-forward manner by selecting appropriate values for receiver scaling dividends, Xs, and for the transmitter scaling dividends, Ys. Naturally, there may be practical limitations to how large values of X and Y it is possible to provide on an integrated circuit where die area and circuit complexity must be taken into consideration. Very small values of X and Y, such as values less than 12 or 10 may also be impractical to use for applications wherein the required scaling ratio or ratios are very small, i.e. smaller than 32/31.

The first and second group of selectable receiver/transmitter scaling dividends from which X and Y, respectively, can be selected may both comprise one or several scaling dividends selected from the group consisting of: (14, 15, 16, 31, 32, 56, 60, 62, 64). According to a preferred embodiment of the invention, both the first and second groups of selectable scaling dividends are constituted by scaling dividends (56, 60, 62, 64).

According to another preferred embodiment of the invention, the CDR circuit is furthermore adapted to provide a selectable nominal bit rate. The transmitter PLL that generates the output clock signal is also adapted to provide the selectable nominal bit rate where the nominal bit rate is selected from a plurality of predetermined nominal bit rates. This embodiment of the invention provides a true multi-rate transponder system wherein the transport network bit rate may be scaled with a selectable scaling ratio with respect to any selected corresponding nominal bit rate. This embodiment of the invention is particularly advantageous in communication networks that require true multi-rate capability of the transponder system and circuits because data are communicated between network nodes according to several differing communication protocols. In this scenario, a single multi-rate transponder circuit or, optionally, chip set is capable of supporting the several differing communication protocols, thus minimising hardware requirements and improving reliability of the network nodes in the communication system. This embodiment of the invention allows the system controller to perform on-the-fly alteration of the current communication protocol supported by the multi-rate transponder circuit. To control the operation of the receiving and transmitting parts, pin programming or writing to a dedicated control register could be utilised.

Adapting the CDR circuit of the receiving part to receive the incoming data stream at a selectable nominal bit rate is, preferably, achieved by using the previously described line rate PLL loop which comprises a receiver line divider circuit arranged within the line rate PLL loop in the CDR circuit. The receiver line divider circuit provides a plurality of predetermined receiver line dividends that each may correspond to a particular nominal bit rate of the plurality of predetermined nominal bit rates of the incoming data stream. The transmitting part comprises a transmitter line divider circuit that is adapted to generate a transmitter line divider signal based on an output signal of the transmitter PLL loop so as to generate the output clock signal based on the transmitter line divider signal. By selecting identical receiver and transmitter line dividends the receiving part is capable of receiving the incoming data stream at a selected nominal bit rate of the plurality of predetermined nominal bit rates, and the transmitting part is capable of transmitting the outgoing data stream at that selected nominal bit rate. The plurality of predetermined receiver and transmitter line dividends are preferably selected from the group consisting of: (1, 2, 4, 8, 16, 32, 64). According to a preferred embodiment of the invention the plurality of predetermined receiver line dividends are equal to the plurality of predetermined transmitter line dividends and constituted by a group of line dividends consisting of values: (1, 2, 4, 16) that supports the standard communication protocols: SDH STM-1/STM-4/STM-16 and 1.250 Gbit/s Gigabit Ethernet.

Preferably, at least one of the plurality of predetermined nominal bit rates equals a nominal bit rate of a standard communication protocol, and more preferably, each of the plurality of predetermined nominal bit rates equals a respective nominal bit rate of a standard communication protocol. Consequently, according to this last embodiment of the invention, there may be provided a multi-rate transponder system and circuits that support reception and transmission of incoming/outgoing data streams at the nominal bit rate or at the corresponding transport network bit rate according to any one of a plurality of supported standard communication protocols. Furthermore, both the nominal bit rate and the corresponding transport network bit rate may be independently supported for the incoming as well as the outgoing data streams. The standard communication protocol may be any existing or planned communication protocol such as SDH STM-1, SDH STM-4, SDH STM-16, SDH STM-64, Ethernet GE 1.250 Gbit/s, etc. A multi-rate transponder system and circuits that support e.g. SDH STM-1, SDH STM-4, SDH STM-16 must therefore be capable of receiving and transmitting incoming and outgoing data streams at nominal bit rates of 155 Mbit/s, 622 Mbit/s and 2.488 Mbit/s and also support one or several corresponding transport network bit rates.

The wide span in bit rates of the incoming data stream that is supported by some embodiments of the present multi-rate transponder system and circuits may require that the line rate PLL of the CDR circuit has a relatively wide bandwidth to accommodate standardised recommendations, such as ITU-T G.958 requirements, to jitter tolerance of the CDR circuit at all the supported bit rates. As a consequence, the CDR circuit may transfer more jitter from the incoming data stream to the transmitting part than would normally be allowed to achieve the jitter specifications recommended by ITU-T G.825 for the overall multi-rate transponder system. However, according to a preferred embodiment of the invention, this penalty in terms of jitter transfer of the CDR circuit is counteracted by applying the previously described dual transmitter PLL system. This transmitter PLL system comprises a first, VCXO based and narrow bandwidth, PLL for receiving the reference clock signal provided by the CDR circuit and performs an effective suppression of jitter in the reference clock signal. The "cleaned" reference clock signal is then transferred to the second, and wide bandwidth, transmitter PLL from which the output clock signal is generated. Accordingly, due to the application of the dual transmitter PLL system, this embodiment of the invention is capable of providing an overall system that achieves ITU-T G.958 jitter tolerance for a wide span of nominal and transport network bit rates.

In practical communication networks, the incoming data stream may be absent in shorter or longer time periods due to network faults, repairs, etc. Such a zero input signal condition to the CDR circuit will often cause the tuning of the CDR circuit to drift away from the optimal tuning frequency, which is equal to the nominal bit rate of the incoming data stream, so that when the input signal is re-established, the CDR circuit may require intolerable long time to again acquire lock to the incoming data stream. According to a preferred embodiment of the invention, this problem is solved by utilising a line clock source in the multi-rate transponder system, the line clock source being adapted to generate a line clock signal which forces the CDR circuit to obtain an optimum tuning frequency when the incoming data stream is absent. The CDR circuit comprises a scaling PLL loop, arranged in parallel to the line rate PLL loop. The receiver scaling divider circuit is arranged within this scaling PLL loop which is furthermore adapted to receive and lock onto the line clock signal and the CDR circuit comprises loop selection means adapted to select whether the line rate PLL loop or the scaling PLL loop is inserted into the CDR circuit, thereby locking the CDR circuit to the line clock source or to the incoming data stream. The line clock signal accordingly controls the tuning of the CDR circuit when the incoming data stream is absent through the operation of the scaling PLL loop that is arranged in parallel to the line rate PLL loop. During normal operation, i.e. when the incoming data stream is present at a correct bit rate and level, the CDR circuit is locked onto the incoming data stream by the operation of the line rate PLL loop that is activated by the loop selection means. If the incoming data stream disappears, the loop selection means may, on certain predetermined criteria, activate the scaling PLL loop which, due to he PLL action of the line rate PLL loop, forces the CDR circuit to staying tuned to the expected frequency of the incoming data stream if the frequency of the line clock signal is appropriately selected as described below.

The line clock source may therefore be adapted to provide the line clock signal with a frequency that tunes the CDR circuit for reception of the incoming data stream at one of the plurality of predetermined nominal bit rates or at one of the corresponding transport network bit rates. Thereby, the CDR circuit's acquisition time is minimised by tuning the CDR circuit to the expected bit rate of the incoming data stream when the data stream is absent, the expected bit rate being equal to a nominal bit rate or a corresponding transport network bit rate.

Since the receiver scaling divider circuit arranged within the scaling PLL loop is locked to the line clock signal, the tuning frequency of the CDR circuit is controlled as being equal to the frequency of the line clock signal multiplied with the selected receiver scaling dividend, X, of the receiving part.

The line clock source is preferably a high accuracy and stable clock source with a well defined centre frequency. Such a source may comprise a crystal oscillator or, according to a preferred embodiment, comprise a voltage controlled oscillator, such as a VCXO. The line clock source is preferably adapted to provide a centre frequency equalling a nominal bit rate of a standard communication protocol divided by and integer number, Z, between 12 and 128. Preferably, the value of Z is made equal to one of the selectable receiver scaling dividends, X. If the value of the selected receiver scaling dividend, X, is equal to the value of Z, the tuning frequency. of the CDR circuit will be adjusted to a frequency that is equivalent to the nominal bit rate of the incoming data stream. If the selected receiver scaling dividend, X, on the other hand is larger or smaller than the value of Z, the tuning frequency of the CDR circuit will be adjusted to a frequency that is a scaling ratio of X/Z higher or lower, respectively, than the nominal bit rate of the incoming data stream. Thereby, the required support of the receiving part of incoming data streams at both nominal rates and at corresponding increased rates is provided. Accordingly, the integrated circuit designer may provide the multi-rate transponder system with the capability of supporting a plurality of differing transport network bit rates at each nominal bit rate through appropriate selection of the receiver scaling dividends and the centre frequency of the line clock source. Furthermore, since the scaling PLL loop, which comprises the receiver scaling dividends,.is arranged in parallel to the line rate PLL loop, which provides the plurality of predetermined receiver line dividends, in the CDR circuit, the CDR circuit may be adapted to receive any supported nominal bit rate without affecting the reception of the corresponding transport network bit rate.

In the above-mentioned embodiment of the invention, the transmitting part may comprise the previously mentioned the dual transmitter PLL system so that the first transmitter PLL, within its loop, includes a voltage controlled line clock source, preferably the VCXO source, having a centre frequency equal to a target nominal bit rate divided by an integer, Z. The second transmitter PLL loop may include the transmitter scaling divider circuit which provides a number of transmitter scaling dividends, Y. If the values of the transmitter scaling dividends are equal to the values of the receiver scaling dividends it is possible to control the frequency of the output clock signal to be increased/decreased with a scaling ratio of Y/Z relative to the nominal bit rate. Since the value of the transmitter scaling dividend, Y, preferably can be selected independently of the value of the receiver scaling dividend, X, the present multi-rate transponder system may have the capability of supporting incoming and outgoing data streams of differing bit rates such as an incoming data stream at a transport network rate and an outgoing data stream at nominal rate or vice versa.

The loop selection means, which controls whether the line rate PLL or the scaling PLL is activated in the CDR circuit, may comprise a lock detection circuit adapted to compare frequencies of the reference clock signal and the line clock signal to generate a loop selection signal in accordance with predetermined criteria relating to the result of the comparison. The loop selection signal controls a multiplexer that is adapted to insert the scaling PLL or the line rate PLL in CDR circuit. The predetermined criteria that determines which PLL loop to activate may comprise that:

if a frequency difference between the reference clock signal and the line clock signal is larger than a predetermined threshold value, the loop selection means inserts the scaling PLL loop in the CDR circuit. One the other hand, If the frequency difference is smaller than or equal to the predetermined threshold value, the loop selection means are adapted to lock the CDR circuit to the incoming data stream. The predetermined threshold value is preferably selected to about 2000 ppm or more preferably about 500 ppm. Accordingly, the loop selection means monitors the frequency of the reference clock signal, which is a divided frequency of the equivalent bit rate of the incoming data stream, and compares it to the frequency of the line clock signal which is generated by a stable line clock source. If these frequencies differ with an amount larger than the threshold value, the incoming data stream can be considered lost and the CDR circuit should, accordingly, be controlled by the scaling PPL which tunes the CDR circuit to the frequency that is equivalent to the expected bit rate of the incoming data stream.

According to a preferred embodiment of the invention, a major part of the functionality of the multi-rate transponder system is provided on three integrated circuits. The circuitry of the receiving part is substantially comprised on a first integrated circuit, and the circuitry of the transmitting part is substantially comprised on a second. integrated circuit. The system controller is substantially comprised on a third Application Specific Integrated Circuit. Alternatively, the receiving part and the transmitting part could be integrated on a single integrated circuit, this may, however, lead to cross-talk problems between those circuit blocks, such as PLLs and VCOs, that have to be operating at different clock frequencies in some applications.

A second aspect of the invention relates to a multi-rate receiver circuit for receiving an incoming serial data stream and recovering a data signal and clock signal of the incoming serial data stream, the receiver circuit comprising:

a Clock and Data Recovery (CDR) circuit adapted to receive the incoming serial data stream at one of at least two predetermined nominal bit rates or at one of at least two corresponding transport network bit rates, the CDR circuit being adapted to derive a clock signal and a data signal from the incoming serial data stream, a data transfer circuit adapted to generate an incoming data signal based on the derived data signal on one or several externally accessible data transfer channels, and a clock transfer circuit adapted to generate a receiver clock signal on an externally accessible receiver clock line, thereby providing a multi-rate receiver circuit for reception of incoming data streams at two or more nominal bit rates or at the two or more corresponding transport network bit rates.

According to a preferred embodiment of the invention, each of the at least two predetermined nominal bit rates is related to its corresponding transport network bit rate according to a scaling ratio, so that:

transport network bit rate=(M/N)*nominal bit rate; wherein (M/N) is the scaling ratio; M, N being positive integer numbers and M>N.

The multi-rate receiver circuit may be provided as a single stand-alone integrated circuit or as a combination of an integrated circuit and one or several external circuit blocks. Alternatively, the multi-rate receiver circuit may form part of a larger integrated circuit that also integrates a complete portion or major part of a multi-rate transmitter circuit described below.

A third aspect of the invention relates to a multi-rate transmitter circuit for transmitting an outgoing serial data stream based on an outgoing data signal, the receiver circuit comprising:

a transmitter Phase Locked Loop (PLL) adapted to receive and lock onto a reference clock signal and to generate an output clock signal based on the reference clock signal, a transmitter clock circuit adapted to generate the transmitter clock signal to a system data transfer means, a data reception circuit adapted to receive the outgoing data signal from the system data transfer means and to generate the serial outgoing data stream at one of at least two predetermined nominal bit rates or at one of at least two corresponding transport network bit rates, the serial outgoing data stream being based on the outgoing data signal and the output clock signal.

Preferably, each of the at least two predetermined nominal bit rates is related to its corresponding transport network bit rate according to a scaling ratio, so that:

transport network bit rate=(M/N)*nominal bit rate; wherein (M/N) is the scaling ratio; M, N being positive integer numbers and M>N.

According to a preferred embodiment of the invention, the transmitter circuit comprises at least two PLLs, a first transmitter PLL adapted to receive and lock onto the reference clock signal and generate a first transmitter PLL signal, the first transmitter PLL having a narrow loop bandwidth, and a second transmitter PLL adapted to lock onto the first transmitter PLL signal and to generate the output clock signal based on the first transmitter PLL signal, the second transmitter PLL having a wide loop bandwidth.

In a practical multi-rate transponder chip set operating in a communication system, the incoming data stream will contain some amount of jitter. The transfer of jitter from a receiving circuit or part to the transmitter circuit or part should to the extent possible be suppressed to minimise jitter content in the outgoing data stream. According to this embodiment of the invention, this has been achieved by first suppressing transfer of jitter in the reference clock signal that has been derived from a jitter infected incoming serial data stream by the narrow bandwidth of the first transmitter PLL, and then subsequently suppress jitter generation within the second PLL by designing the loop with a wide bandwidth so as to provide a low jitter outgoing serial data stream.

BRIEF DESCRIPTION OF THE DRAWINGS

A preferred embodiment of a multi-rate transponder system and a multi-rate transponder chip set according to the invention are described in the following with reference to the drawings, wherein.

DETAILED DESCRIPTION OF A PREFERRED EMBODIMENT

In the following, a specific embodiment of an integrated chip set according to the invention is described and discussed in greater detail. The present description shows an overall circuit topology of a receiver chip set in the form of a simplified block diagram. Furthermore, essential circuit blocks, including a CDR circuit, a first transmitter PLL circuit, a second transmitter PLL circuit, divider circuits, etc that are distributed over two ASICs that implement a multi-rate transponder chip set that supports reception and transmission of serial data streams according to the communications protocols SDH STM-1, STM-4, STM-16 and Ethernet GE 1.250 Gbit/s as well as several corresponding transport network bit rates or increased bit rates for each of those standard communication protocols.

The skilled person will realise that the illustrated partitioning of the individual circuit blocks between that receiver chip and the transmitter chip is not limiting for the scope of the present invention. Different partitioning of individual circuit blocks between the transmitter and receiver chip may be advantageous in some applications, depending on practical criteria, such as pin count, die area, signal coupling between circuit blocks over a common substrate connection and/or common power nets etc. Corresponding features of circuits and circuit blocks that are illustrated in more than one drawing have been given the same reference numbers.

Many data/clock signal lines and input/output terminals of the illustrated circuit blocks and/or chips are illustrated as carrying single ended signals for convenience and to simplify the drawings. However, the present embodiment of the integrated circuit utilises a fully differential signal processing and, accordingly, fully differential circuit blocks, such as logic gates, amplifiers, comparators etc. The fully differential signal processing has the effect that each terminal on the circuit blocks and each interconnecting line between the circuit blocks of the present drawings in the present embodiment of the invention represent two terminals or two signal lines, respectively, providing oppositely phased versions of the same signal. The fully differential signal processing has several advantages, relating to improving noise rejection and minimising internal coupling between various circuit blocks.

To support the required high-speed operation of the present multi-rate transponder chip set and system, logic gates of the chip set are preferably implemented as CML logic using bipolar transistors. The preferred process is a 0.4 μm Bipolar process suitable for mixed signal circuits operating within the frequency range of about 0 Hz to 10 GHz. The bipolar transistors provided by this process have $f_T$ values of about 25 GHz. For integrated circuits that are required to operate at even higher frequencies than the present integrated circuit, other commercially available or proprietary BiCMOS or bipolar processes could be utilised that may provide bipolar transistors with $f_T$ values of about 50–75 GHz.

Figure 1:
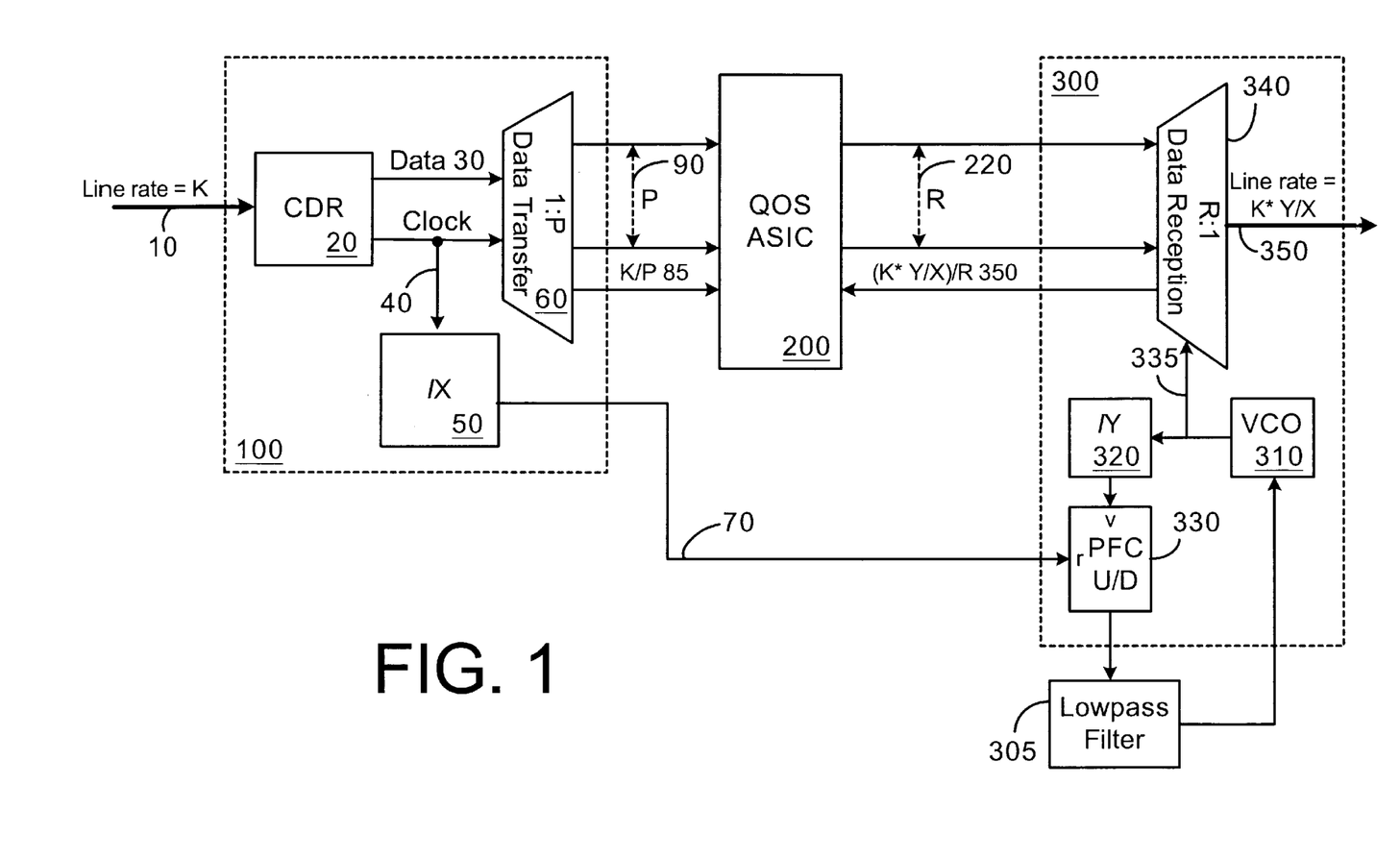
FIG. 1 is a block diagram illustrating a simplified multi-rate transponder system according to the invention.

In the simplified block diagram of FIG. 1, the incoming data stream at a line rate or nominal bit rate, K, is received by a receiving chip 100 of a multi-rate transponder chip set (100 and 300) over line input 10 and provided to a CDR circuit 20 which is adapted to derive a clock signal 40 on a clock line and a serial data signal 30 on a data line. The data signal 30 is transferred to a data transfer circuit 60 that also comprises a de-multiplexer circuit which splits the data signal 30 into a P-channel data signal, preferably comprising 16 or 32 channels, each channel operating at a lower bit rate than the line rate K, preferably at bit rate of K/P, to generate a multi-channel incoming data signal. The multi-channel incoming data signal is transferred to a system controller 200 over a P-channel data bus 90 to data receiving means (not shown) in the system controller 200. The transfer of data of each P-channel data word over the P-channel data bus 90 is controlled by a receiver clock signal on a receiver clock line 85. This receiver clock signal has been derived by dividing the derived clock signal 40 provided by the CDR circuit 20 by integer value P in a clock transfer circuit (not shown). Accordingly, if the bit rate of the incoming data stream is K bit/s, the clock frequency of the receiver clock signal is K/P Hertz.

The derived clock signal 40 provided by the CDR circuit 20 is also applied to a receiver scaling divider circuit 50 that divides the clock signal 40 by a receiver scaling dividend which, preferably, is an integer number X, as illustrated to generate a reference clock signal 70 that is transferred to a transmitting chip 300 of the multi-rate transponder chip set (100, 300) over a reference clock line. The actual value of X may be selected from a group of predetermined receiver scaling dividends by programming logic levels of one or several externally accessible pins (not shown) of the receiver chip 100. This allows the system controller 200 to control the actual setting of the receiver scaling dividend, X. The value of X is preferably selected to be in the range of 12 to 128, such as a group of values that includes 56, 60, 62 and 64. These values of X provide a practical frequency range for the reference clock signal 70, even where the derived clock signal 40 provided by the CDR circuit 20 is in the several GHz range. A previously mentioned number of selectable receiver scaling dividends, X, is preferably provided in the receiver chip such as 2, 3 or 4 different dividends.

In the transmitting part 300, the reference clock signal 70 is applied to a reference input terminal of a Phase Frequency Detector (PFD) 330 which forms part of a transmitter PLL loop that also comprises a transmitter VCO 310, a transmitter scaling divider circuit 320, which is adapted to divide by a transmitter scaling dividend, Y, and an external lowpass filter 305 setting one or several time constants of the loop.

Due to the PLL feed-back in the transmitter PLL loop, an output clock signal 335 which is synchronous with respect to the applied reference clock signal on the reference input terminal of the PFD 330, and having a frequency that is multiplied with the value of Y with respect to the same, is generated on an output clock line 335. By appropriate selection of receiver and transmitter scaling dividends X and Y, respectively, in the receiving chip 100 and transmitting chip 300, respectively, the bit rate of the serial outgoing data stream provided on data line 350 can be controlled as being a scaling ratio, Y/X, times the line rate, K, of the incoming data stream. The value of each of the scaling dividends Y and X is preferably independently selectable by respective associated pin sets (not shown). A second transmitter PLL (not shown) is preferably also included on the transmitter part 300, but has been left out of FIG. 1 for clarity. This second transmitter PLL is described in connection with FIG. 3 which is a more detailed block diagram of the transmitter chip 300.

Several predetermined values of the scaling dividend, X, in the receiver scaling divider circuit 50 and several predetermined values of the scaling dividend Y in the transmitter scaling divider circuit 320 are preferably provided. If Y is larger than X, and assuming that the incoming data stream is received at a nominal bit rate of a communication protocol, the outgoing data stream will be transmitted at a transport network bit rate if the values of X and Y are appropriately selected. The required overhead data may be generated and inserted into the outgoing data signal on an R-channel data bus 220 by the system controller 200. The control of transfer of the R-channel outgoing data signal on data bus 220 is provided by a transmitter clock signal 350 which is generated by a transmitter clock circuit which may be integrated within a data reception circuit 340 of the transmitter chip 300. Transmitter clock signal 350 must be synchronous with respect to the outgoing clock signal provided on line 335 to properly time the transmission of the outgoing data stream to the reception of the R-channel outgoing data signal. Since the bit rate of the outgoing data stream is:

K*Y/X, where K is the bit rate of the incoming data stream, the transmitter clock signal 350 is preferably generated so as having clock frequency of: (K*Y)/(X*R).

Figure 2:
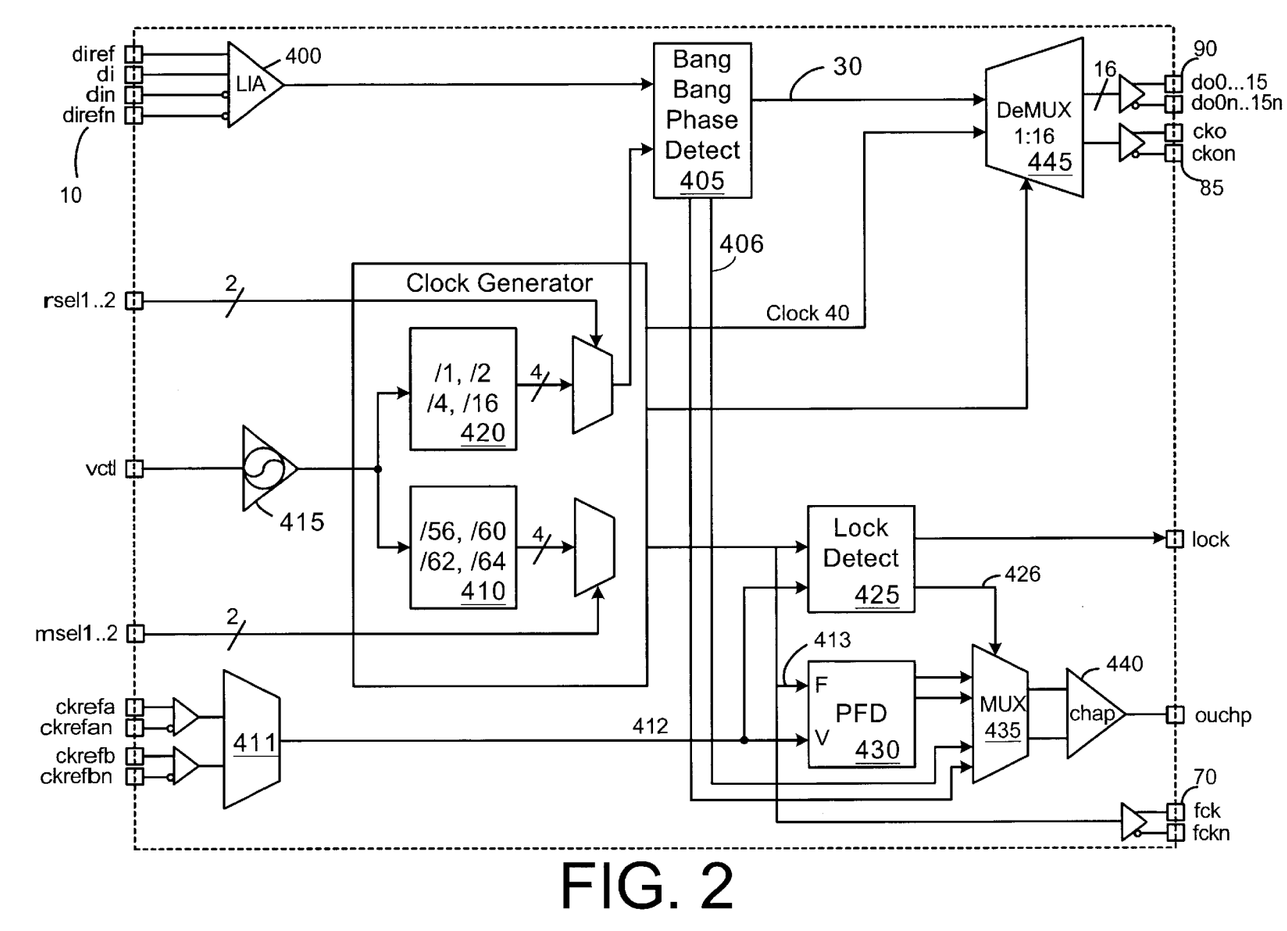
FIG. 2 is a simplified block diagram illustrating key circuit blocks of a preferred embodiment of an integrated receiver chip of a receiver/transmitter chip set according to the invention.

FIG. 2 shows in more detail the receiving chip 100 of FIG. 1. The CDR circuit comprises within a line rate PLL loop a receiver VCO 415, a receiver scaling divider circuit 420 which provides receiver line dividends 1, 2, 4, 16 to provide a divided VCO signal to a first input terminal of a Bang-Bang phase detector 405. The value of the receiver line dividend, X, is selectable by controlling logic levels of external pins, RSEL1 . . . 2. An output signal of Bang-Bang phase detector 405 is provided to a multiplexer 435 over (differential) signal lines 406 and transferred to a tri-state charge pump 440 which, by the use of internal current sources, is responsible for charging a loop filter capacitor (not shown) connected to terminal OUCHP. The loop filter capacitor, and optionally a series resistor, sets one or several time constant of the line rate PLL loop to control its bandwidth and also of a parallelly arranged scaling PLL loop described below. A control voltage developed across the loop filter capacitor is applied to an input terminal, VCTL, of the VCO 415, thereby closing the loop of the line rate PLL.

A Limiting Input Amplifier 400 interfaces to differential input terminals DI and DIN to receive the incoming data stream and applies an amplified signal to a second terminal of the Bang-Bang phase detector 405. The data bits of the incoming data stream are derived, by the PLL action of the line rate PLL, to provide a derived data signal on data line 30 and the derived clock signal, which is based on the divided line rate PLL signal at the output of the line rate divider circuit 420, is provided to a demultiplexer circuit 445 on a clock line 40. A demultiplexer circuit 445 splits the derived data signal into 16 data transfer channels, each operating at a lower bit rate, on corresponding differential terminal pairs DO0 . . . 15 and DO0N . . . 15N. The data channels are connected to the system controller to transfer the incoming data signal to the controller, as explained in connection with FIG. 1.

The CDR circuit also comprises a second PLL in the form of a scaling PLL, arranged in parallel to the line rate PLL. This scaling PLL is formed around a receiver scaling divider circuit 410 connected to the output terminal of the VCO 415 in parallel to the line divider circuit 420, to generate a reference clock signal 70 which is available on a pair of (differential) reference clock terminals, FCK and FCKN. The reference clock signal is forwarded to the transmitter chip 300 shown on FIG. 3 (or on FIG. 1). The reference clock signal 70 is also provided to a Lock Detect circuit 425 and a first terminal 413 of a Phase-Frequency Detector 430 which receives a line clock signal on a second terminal 412. The line clock signal is, preferably, generated by a VCXO circuit connected to terminals XCK1 and XCK1N and arranged within a first transmitter PLL loop (comprising Phase-Frequency Detector 330 of FIG. 3) arranged on the transmitter chip 300 and provided on terminals CKREFA and CKREFAN of the receiver chip through a multiplexer 411.

The VCXO circuit generates a line clock signal with a frequency that equals a nominal bit rate of a target communication protocol divided by an integer number. In the present embodiment of the invention, the nominal bit rate of the target communication protocol is the 2.488 Gbit/s rate of STM-16. The integer number preferably equals one of the receiver scaling dividends, X, and is selected to 62 in the present embodiment of the invention, since the group of receiver scaling dividends comprises values (56, 60, 62, 64) as previously mentioned. Accordingly, the centre frequency of the VCXO circuit should be selected to 40.129 MHz (2.488 GHz/62) and the frequency multiplication provided by the scaling PLL due to the selectable receiver line dividends in circuit 410 makes it possible to control the tuning frequency of the CDR circuit to the 2.488 Gbit/s nominal bit rate or a higher or lower bit rate. The value of the receiver scaling dividend is selectable by controlling logic levels of external pins, MSEL1 . . . 2.

An output signal of the Phase-Frequency Detector 430 is provided to a multiplexer 435 connected to the charge pump 440. The multiplexer 435 is also connected to the output signal 406 of the Bang-Bang Phase detector 405 and the scaling PLL loop is, accordingly, closed around the same circuits as the line rate PLL loop; charge pump 440, the loop filter capacitor and the VCO 415. The multiplexer 435 controls, by a steering signal 426 from the lock detect circuit 425, which loop of the two parallel loops that is active in the CDR circuit by enabling either the output signal of the Phase-Frequency Detector (PFD) 430 or the output signal of the Bang-Bang Phase detector 405 to control the charge pump 440. The lock detect circuit 425 continuously monitors a frequency difference between the reference clock signal on line 70 and the line clock signal from the VCXO based line clock source on terminal 412 of the PFD 430. If these signals differ more than a predetermined value such as 500 ppm or 2000 ppm, the scaling PLL is activated in the CDR circuit so that the CDR circuit is locked onto the line clock signal provided by the VCXO circuit rather than locked onto the incoming data stream. Hereby, it is assured that the CDR circuit is always kept within its lock-in range in relation to an expected bit rate of the incoming data stream if the incoming data stream for some reason is absent or at an erroneous bit rate. One advantage of this technique is that predictable lock-up conditions for the CDR circuit is assured because the oscillation frequency of VCO 415 is kept within a range that allows the Bang-Bang Phase detector 405 to acquire lock to the incoming data stream. Furthermore, since the VCXO circuit also operates as a voltage controlled oscillator in the first transmitter PLL loop it provides a narrow band lowpass filtering of the reference clock signal which causes an effective suppression of jitter in the incoming data stream that otherwise would have been passed to the outgoing data stream.

In the present embodiment of the receiver chip, the bandwidth of the line rate PLL is adjusted to being larger than at least 1 MHz, preferably larger than 1.5 or 2.0 MHz to accommodate the ITU-T G.958 requirements with respect to minimum jitter tolerance at all the supported nominal and transport network bit rates.

Figure 3:
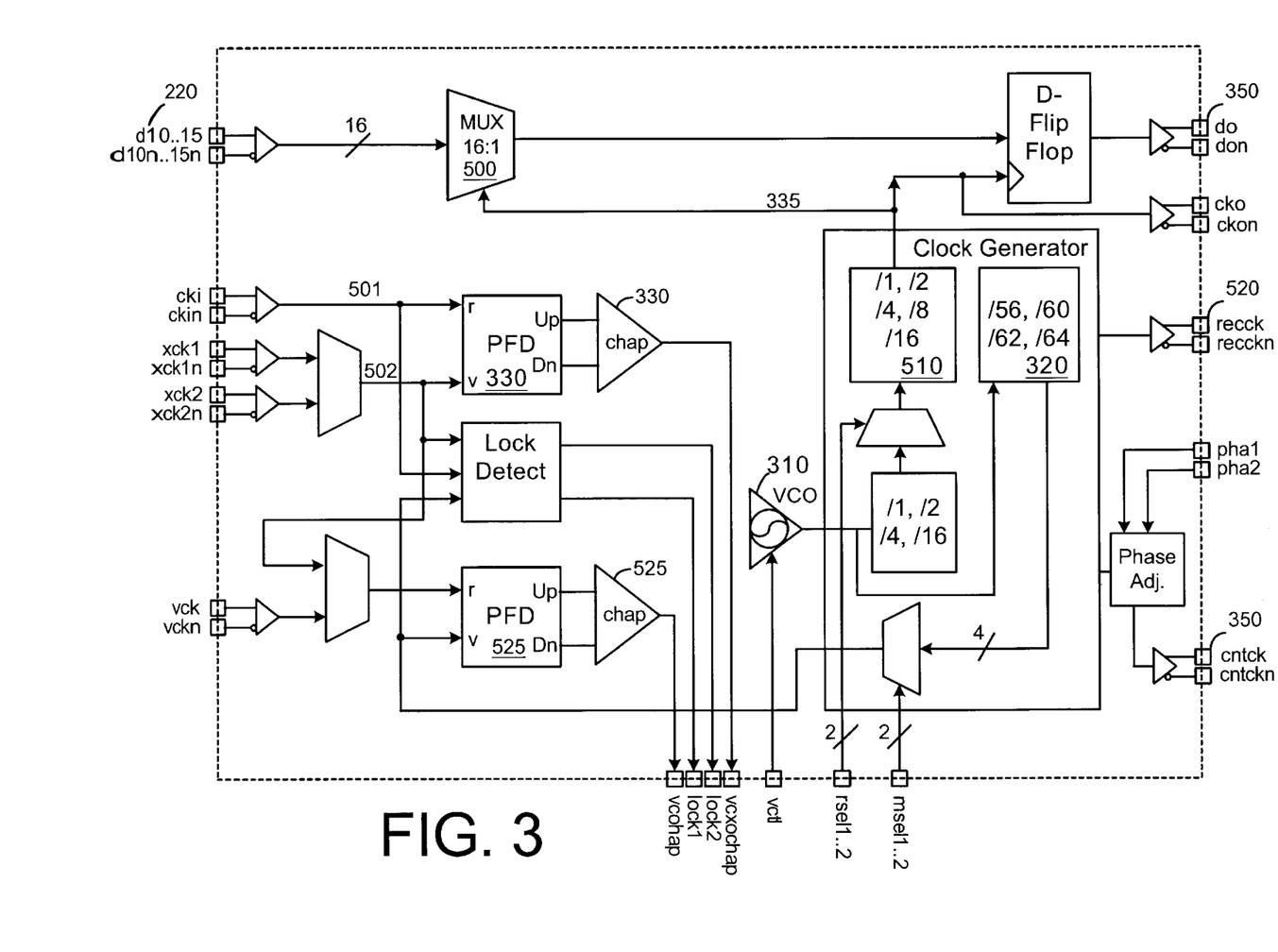
FIG. 3 is a block diagram illustrating key circuit blocks of a preferred embodiment of an integrated transmitter chip of a receiver/transmitter chip set according to the invention.

FIG. 3 shows in more detail the transmitter integrated circuit 300 of FIG. 1. An outgoing data signal is applied on a 16 channel data bus to 16 corresponding pairs of differential terminals 220 from the system data transfer means of the system controller. The 16 outgoing data channels are connected to a 16:1 multiplexer 500 and assembled into a serial data stream at a bit rate that is equal to 16 times the bit rate of each data signal channel. The multiplexer 500 is clocked by an output clock signal provided on line 335 by a transmitter line divider circuit 510 which is also connected to an output signal of a second transmitter PLL comprising VCO 310. The output clock signal is also provided on external differential terminals CKO and CKNO.

The reference clock signal from the receiver integrated circuit is transferred to the transmitter integrated circuit on terminals CKI and CKIN and provided to a reference input 501 of a first Phase Frequency Detector (PFD) and associated charge pump 330. This circuit block 330 forms part of a first transmitter PLL that comprises an external capacitor connected to an output terminal of the charge pump on external terminal VCXOCHAP that is connected to a loop time constant capacitor (or capacitor and resistor) providing a control voltage to a VCXO circuit (not shown). The VCXO generates a line clock signal with a frequency substantially proportional to the applied control voltage. The line clock signal is applied to external differential terminals XCK1 and XCK1N and provided to a control terminal of the first Phase Frequency Detector (PFD), to close the loop of the first transmitter PLL.

What is claimed is:

1. A multi-rate transponder system for receiving an incoming serial data stream and transmitting an outgoing serial data stream, the multi-rate transponder system comprising:

a receiving part, a system controller and a transmitting part;

the receiving part comprising:

a Clock and Data Recovery(CDR) circuit adapted to receive the incoming serial data stream at a nominal bit rate or at a corresponding transport network bit rate, the CDR circuit being adapted to derive a clock signal and a data signal from the incoming serial data stream, and a data transfer circuit adapted to generate an incoming data signal based on the derived data signal on a data transfer channel, and a clock transfer circuit adapted to generate a receiver clock signal on a receiver clock line, and a reference clock circuit adapted to generate a reference clock signal for the transmitting part based on the derived clock signal, the system controller comprising:

system data receiving means, system data transfer means, system data processing means and a slide-buffer, the system data receiving means being adapted to receive the incoming data signal from the data transfer channel and the receiver clock signal from the receiver clock line and to provide the incoming data signal to the slide-buffer for clock domain transfer, and the system data processing means being adapted to process the incoming data signal in the slide-buffer by performing at least one of inserting data bits into the incoming data signal, extracting data bits from the incoming data signal, and monitoring data bits in the incoming data signal, to generate an outgoing data signal to the system data transfer means on the data transfer channel, and the system data transfer means being adapted to provide the outgoing data signal to the transmitting part in response to a transmitter clock signal provided on a transmitter clock line, the transmitting part comprising:

a transmitter Phase Locked Loop (PLL) adapted to receive and lock onto the reference clock signal and to generate an output clock signal based on the reference clock signal, a transmitter clock circuit adapted to generate the transmitter clock signal to the system data transfer means, a data reception circuit adapted to receive the outgoing data signal from the system data transfer means and to generate the serial outgoing data stream at the nominal bit rate or at the corresponding transport network bit rate independently of the bit rate of the incoming serial data stream, based on the outgoing data signal and the output clock signal.

2. A multi-rate transponder system according to claim 1, wherein the transmitter part comprises at least two PLLs, a first transmitter PLL adapted to receive and lock onto the reference clock signal and generate a first transmitter PLL signal, the first transmitter PLL having a narrow loop bandwidth, and a second transmitter PLL adapted to lock onto the first transmitter PLL signal and to generate the output clock signal based on the first transmitter PLL signal, the second transmitter PLL having a wide loop bandwidth, thereby suppressing transfer of jitter from the incoming serial data stream in the multi-rate transponder system by the first transmitter PLL and suppressing jitter generation within the multi-rate transponder system by the second transmitter PLL.

3. A multi-rate transponder system according to claim 2, wherein the first transmitter PLL comprises a VCXO circuit operating as a voltage controlled oscillator within the first transmitter PLL.

4. A multi-rate transponder system according to claim 2, wherein the narrow loop bandwidth of the first transmitter PLL is a loop bandwidth less than 130 kHz.

5. A multi-rate transponder system according to claim 2, wherein the narrow loop bandwidth of the first transmitter PLL is a loop bandwidth less than 30 kHz.

6. A multi-rate transponder system according to claim 2, wherein the wide loop bandwidth of the second transmitter PLL is a loop bandwidth larger than 200 kHz.

7. A multi-rate transponder system according to claim 1, wherein the wide loop bandwidth of the second transmitter PLL is a loop bandwidth larger than 1 MHz.

8. A multi-rate transponder system according to claim 1, wherein the nominal bit rate is related to the corresponding transport network bit rate according to a scaling ratio, so that $$\text{transport network bit rate} = (M/N) * \text{nominal bit rate; wherein}$$

M/N is the scaling ratio, M, N being positive integer numbers, and M>N.

9. A multi-rate transponder system according to claim 8, wherein M=N+1, and N is selected from the group of integers consisting of: (32, 31, 16, 15, 14).

10. A multi-rate transponder system according to claim 1, wherein the transmitting part furthermore comprises a multiplexer circuit adapted to receive an outgoing multi-channel data signal representing the outgoing data signal from the system data transfer means, the multiplexer circuit being adapted to generate the serial outgoing data stream based on the outgoing multi-channel data signal and the output clock signal.

11. A multi-rate transponder system according to claim 1, wherein the CDR circuit of the receiving part comprises:

a receiver scaling divider circuit adapted to receive the derived clock signal of the incoming serial data stream and to produce the reference clock signal for the transmitting part by dividing the derived clock signal with a selectable receiver scaling dividend, X, the receiver scaling divider circuit comprising a first group of selectable receiver scaling dividends, each value of X being associated with a particular scaling ratio, a transmitter scaling divider circuit arranged within the transmitter PLL and adapted to divide a PLL signal with a selectable transmitter scaling dividend, Y, the transmitter scaling divider circuit comprising a second group of selectable scaling dividends, each value of Y being associated with a particular scaling ratio, X, Y being independently selectable positive integer numbers.

12. A multi-rate transponder system according to claim 11, wherein the multi-rate transponder system comprises a line clock source adapted to generate a line clock signal, and wherein the CDR circuit of the receiving part furthermore comprises:

a scaling PLL loop, arranged in parallel to the line rate PLL loop, and comprising the receiver scaling divider circuit arranged within the scaling PLL loop, the scaling PLL loop being adapted to receive and lock onto the line clock signal, loop selection means adapted to select whether the line rate PLL loop or the scaling PLL loop is inserted into the CDR circuit, thereby locking the CDR circuit to the line clock source or to the incoming serial data stream.

13. A multi-rate transponder system according to claim 12, wherein the loop selection means comprises:

a lock detection circuit adapted to compare frequencies of the reference clock signal and the line clock signal to generate a loop selection signal in accordance with predetermined criteria relating to the result of the comparison, a multiplexer controllable by the loop selection signal to insert the scaling PLL loop or the line rate PLL loop in CDR circuit.

14. A multi-rate transponder system according to claim 12, wherein the line clock source is adapted to provide the line clock signal with a frequency that tunes the CDR circuit for reception of the incoming serial data stream at one of the plurality of predetermined nominal bit rates or one of the corresponding transport network bit rates, thereby minimising an acquisition time of the CDR circuit by tuning it to an expected bit rate of the incoming serial data stream when it is absent, the expected bit rate being equal to a nominal bit rate or a transport network bit rate.

15. A multi-rate transponder system according to claim 14, wherein the plurality of predetermined receiver and transmitter line dividends are selected from the group consisting of: (1, 2, 4, 8, 16, 32, 64).

16. A multi-rate transponder system according to claim 12, wherein the predetermined criteria comprise that:

if a frequency difference between the reference clock signal and the line clock signal is larger than a predetermined threshold value, the loop selection means inserts the scaling PLL loop in the CDR circuit, and if the frequency difference is smaller than or equal to the predetermined threshold value, the loop selection means are adapted to lock the CDR circuit to the incoming serial data stream, thereby providing a CDR circuit that is locked onto the line clock signal during its acquisition mode by the operation of the scaling PLL loop and locked onto the incoming serial data stream during its CDR mode by the operation of the line rate PLL loop.

17. A multi-rate transponder system according to claim 12, wherein the line clock source comprises a VCXO circuit.

18. A multi-rate transponder system according to claim 17, wherein the VCXO circuit has been selected so as to generate a centre frequency equalling a nominal bit rate of a standard communication protocol divided by an integer number selected from the range 12 to 128.

19. A multi-rate transponder system according to claim 11, wherein the first group of selectable scaling dividends comprises one or more receiver scaling dividend(s), X(s), selected from the group consisting of: (14, 15, 16, 31, 32, 56, 60, 62, 64).

20. A multi-rate transponder system according to claim 11, wherein the second group of selectable scaling dividends comprises one or more transmitter scaling dividend(s), Y(s), selected from the group consisting of: (14, 15, 16, 31, 32, 56, 60, 62, 64).

21. A multi-rate transponder system according to claim 20, the frequency of the line clock signal is selected as being equivalent to a nominal bit rate of the plurality of predetermined nominal bit rates divided by a transmitter scaling dividend, Y, thereby allowing the CDR circuit to be tuned to a nominal bit rate or a transport network bit rate of the incoming serial data stream through selection of values of the receiver scaling dividend, X.

22. A multi-rate transponder system according to claim 11, wherein each transmitter scaling dividend of the second group of selectable scaling dividends corresponds to an identical receiver scaling dividend of the first group of selectable scaling dividends.

23. A multi-rate transponder system according to claim 11, wherein a particular receiver scaling dividend is selectable by controlling a logic level(s) of a first set of pins, thereby allowing the reference clock frequency provided by the receiving part to be selected by the system controller through programming logic level(s) of the first set of pin(s).

24. A multi-rate transponder system according to claim 23, wherein a particular transmitter scaling dividend is selectable by controlling a logic level(s) of a second set of pins, thereby allowing the bit rate of the outgoing serial stream to be multiplied by an selectable integer ratio of X/Y relative to the bit rate of the incoming serial data by the system controller through programming logic level(s) of the second set of pin(s).

25. A multi-rate transponder system according to claim 1, wherein the CDR circuit adapted to receive the incoming serial data stream at the first or at the corresponding transport network bit rate is further adapted to provide a selectable nominal bit rate, and wherein the transmitter PLL generating the output clock signal is adapted to provide the selectable nominal bit rate, the nominal bit rate being selected from a plurality of predetermined nominal bit rates, thereby providing a multi-rate transponder system wherein the transport network bit rate may be scaled with a selectable scaling ratio with respect to any corresponding nominal bit rate.

26. A multi-rate transponder system according to claim 25, wherein the CDR circuit of the receiving part comprises a line rate PLL loop that comprises a receiver line divider circuit arranged within the line rate PLL loop, the receiver line divider circuit being adapted to provide a plurality of predetermined receiver line dividends, each receiver line dividend corresponding to a particular bit rate of the plurality of predetermined nominal bit rates of the incoming serial data stream, and wherein the transmitting part comprises a transmitter line divider circuit being adapted to generate a transmitter line divider signal based on an output signal of the transmitter PLL loop so as to generate the output clock signal based on the transmitter line divider signal, the transmitter line divider circuit also being adapted to provide the plurality of predetermined receiver line dividends, thereby allowing the receiving part to receive the incoming serial data stream at a selected nominal bit rate of the plurality of predetermined nominal bit rates and the transmitting part to transmit the outgoing serial data stream at the selected nominal bit rate.

27. A multi-rate transponder system according to claim 26, wherein a particular receiver line dividend of the plurality of predetermined receiver line dividends is selectable by controlling a logic level or logic level(s) of a third set of pins, and wherein a particular transmitter line dividend of the plurality of predetermined transmitter line dividends is selectable by controlling a logic level or logic level(s) of a fourth set of pins, thereby allowing the receiver line dividend and the transmitter line dividend corresponding to a particular bit rate of the incoming and outgoing serial data streams to be selected by the system controller through programming logic level(s) of the third and fourth set of pin(s).

28. A multi-rate transponder system according to claim 25, wherein at least one of the plurality of predetermined nominal bit rates equals a nominal bit rate of a standard communication protocol.

29. A multi-rate transponder system according to claim 28, wherein the standard communication protocol is selected from the protocol group consisting of: (SDH STM-1, SDH STM-4, SDH STM-16, SDH STM-64, Ethernet GE 1.250 Gbit/s).

30. A multi-rate transponder system according to claim 25, wherein each of the plurality of predetermined nominal bit rates equals a respective nominal bit rate of a standard communication protocol, so as to allow the integrated multi-rate transponder system to receive incoming serial data streams at the nominal bit rate or at a corresponding transport network bit rate of any supported communication protocol and to, independently, transmit outgoing serial data streams at the nominal bit rate or at the corresponding transport network bit rate or to both receive and transmit incoming and outgoing serial data streams, respectively, at the transport network bit rate or at the nominal bit rate.

31. A multi-rate transponder system according to claim 1, wherein the circuitry of the receiving part is substantially comprised on a first integrated circuit, and the circuitry of the transmitting part is substantially comprised on a second integrated circuit, and the system controller is substantially comprised on a third Application Specific Integrated Circuit.

32. A multi-rate transponder system according to claim 1, wherein the data transfer circuit of the receiving part is adapted to generate an incoming data signal based on the derived data signal on multiple data transfer channels, and wherein the system data receiving means of the system controller part is adapted to receive the data signal from the multiple data transfer channels, and wherein the system data processing means of the system controller part is adapted to generate an outgoing data signal to the system data transfer means on the multiple data transfer channels.

33. A multi-rate transponder system according to claim 32, wherein the receiving part further comprises a demultiplexer circuit adapted to receive a clock signal, based on the derived clock signal of the incoming serial data stream, and to receive the derived data signal to provide an incoming multi-channel data signal representing the incoming serial data stream on the multiple data transfer channels.

34. A multi-rate transponder system according to claim 33, wherein the number of channels of the multi-channel data signal is selected from a group consisting of: (4, 8, 16, 32, 64).

* * * * *